(12) United States Patent
Miyagawa et al.

(10) Patent No.: US 8,269,274 B2
(45) Date of Patent: Sep. 18, 2012

(54) SEMICONDUCTOR DEVICE AND METHOD FOR FABRICATING THE SAME

(75) Inventors: Kohei Miyagawa, Osaka (JP); Yasushi Kobayashi, Osaka (JP); Daigo Yamashina, Osaka (JP)

(73) Assignee: Panasonic Corporation, Osaka (JP)

( * ) Notice: Subject to any disclaimer, the term of this patent is extended or adjusted under 35 U.S.C. 154(b) by 538 days.

(21) Appl. No.: 12/613,150

(22) Filed: Nov. 5, 2009

(65) Prior Publication Data

US 2010/0123194 A1 May 20, 2010

(30) Foreign Application Priority Data

Nov. 14, 2008 (JP) .................. 2008-292592

(51) Int. Cl.
*H01L 29/78* (2006.01)
(52) U.S. Cl. ................. 257/335; 257/336; 257/E29.255; 257/E29.256; 438/286
(58) Field of Classification Search .................. 257/335, 257/336, E29.255, E29.256; 438/286, E21.417
See application file for complete search history.

(56) References Cited

U.S. PATENT DOCUMENTS

| | | | |
|---|---|---|---|
| 5,591,657 A | 1/1997 | Fujishima et al. | |
| 5,932,897 A | 8/1999 | Kawaguchi et al. | |
| 6,465,839 B2 | 10/2002 | Takahashi et al. | |
| 6,972,458 B2 | 12/2005 | Suzuki et al. | |
| 7,176,523 B2 * | 2/2007 | Hoshino et al. | 257/341 |
| 7,436,024 B2 | 10/2008 | Kumagai et al. | |
| 2006/0220099 A1 | 10/2006 | Kikuchi et al. | |

FOREIGN PATENT DOCUMENTS

| | | |
|---|---|---|
| JP | 07-176640 | 7/1995 |
| JP | 11-121742 | 4/1999 |

* cited by examiner

*Primary Examiner* — Zandra Smith
*Assistant Examiner* — Paul Patton
(74) *Attorney, Agent, or Firm* — McDermott Will & Emery LLP

(57) ABSTRACT

In a semiconductor substrate of a first conductivity type, first to third drain offset regions of a second conductivity type are formed in that order in a bottom up manner. A body region of the first conductivity type is formed partly in the second drain offset region and partly in the third drain offset region. The second drain offset region has a lower impurity concentration than the first and third drain offset regions. A curvature portion of the body region is located in the second drain offset region.

4 Claims, 7 Drawing Sheets

SEMICONDUCTOR DEVICE AND METHOD FOR FABRICATING THE SAME

CROSS-REFERENCE TO RELATED APPLICATION

This application claims priority to Japanese Patent Application No. 2008-292592 filed on Nov. 14, 2008, the disclosure of which including the specification, the drawings, and the claims is hereby incorporated by reference in its entirety.

BACKGROUND

The present disclosure relates to semiconductor devices, such as high voltage MOS (metal oxide semiconductor) FETs (field effect transistors), and methods for fabricating the same.

In recent years, as the number of elements integrated into a single semiconductor integrated circuit device has been increased, semiconductor integrated circuit devices have been required to integrate high voltage MOS devices, low voltage CMOS (complementary metal oxide semiconductor) devices, bipolar devices, and the like on a single substrate. Characteristics required for high voltage MOS devices include high breakdown voltage, and, in view of shrinking chips, reducing costs, etc., low on-resistance.

Conventionally, high voltage MOS transistors employ a technique for increasing static breakdown voltage (drain breakdown voltage when the gate is in the "off" condition) by forming an electric-field limiting layer in a drain region. However, an electric-field limiting layer formed in a drain region acts as a resistive component during operation of the transistor, causing an increase in on-resistance per unit area of the device. In this way, there is a trade-off between static breakdown voltage and on-resistance.

As one of the techniques for improving such a trade-off between static breakdown voltage and on-resistance, a method is disclosed in which, e.g., in a conventional high voltage MOS transistor, a source region is formed in the surface of a body layer in a self-aligned manner with respect to a sidewall spacer to effectively suppress "surface punch-through" and increase breakdown voltage and current carrying capacity (see Japanese Laid-Open Publication No. 7-176640, for example).

Characteristics of a conventional high voltage MOS transistor will be described below with reference to FIG. 7. As shown in FIG. 7, a P-well 4 and an N-well 5 are formed spaced away from each other in surface portions of an N-type epitaxial layer 3 formed in an upper part of a P-type semiconductor substrate 1. An N$^+$-type buried layer 2 is formed between the P-type semiconductor substrate 1 and the N-type epitaxial layer 3 to suppress operation of a parasitic transistor formed by the P-well 4, the N-type epitaxial layer 3, and the P-type semiconductor substrate 1.

A gate electrode 12 is formed over the P-well 4 with a gate insulating film 11 interposed therebetween. With this gate electrode 12 used as a mask, a P-type base region (channel diffusion region) 7 is formed in a surface portion of the P-well 4 in a self-aligned manner. The P-type base region 7 has a greater diffusion depth than a channel ion bombardment layer 6 underlying the gate electrode 12. The gate electrode 12 extends out over the N-well 5, and a local oxidation film 17 is formed between the extended part of the gate electrode 12 and the P-type semiconductor substrate 1.

An insulating sidewall spacer 10 of an oxide film or the like is formed on the sides of the gate electrode 12 by a CVD (chemical vapor deposition) process. By double diffusion using this insulating sidewall spacer 10 and the gate electrode 12 as a mask, an N$^+$-type source region 8 is formed in the P-type base region 7 in a self-aligned manner, and an N$^+$-type well contact (drain) region 9 is formed in the N-well 5.

An interlayer dielectric film 16 is formed on the P-type semiconductor substrate 1 as well as over the gate electrode 12, and contact plugs 13 and 14, which are respectively coupled to the N$^+$-type well contact region 9 and the N$^+$-type source region 8, are formed in contact holes made in the interlayer dielectric film 16. On the interlayer dielectric film 16, extraction electrodes 15 are formed, which are coupled to the respective contact plugs 13 and 14 and serve as a source electrode and a drain electrode. A passivation film (not shown) is formed on the interlayer dielectric film 16 as well as on the extraction electrodes 15.

The conventional example set forth above is characterized in that the N$^+$-type source region 8 is formed in a self-aligned manner by double diffusion using the insulating sidewall spacer 10 and the gate electrode 12 as a mask, rather than only using the gate electrode 12 as a mask, thereby increasing the size of the channel region formed of the P-type base region 7 in a lateral direction by the width of the insulating sidewall spacer 10. This provides effective suppression of "surface punch-through", thereby increasing both breakdown voltage and current carrying capacity.

SUMMARY

However, in the conventional high voltage MOS transistor, although breakdown voltage and current carrying capacity are increased by the above-described method, the low-impurity-concentration N-type epitaxial layer serving as an electric-field limiting layer is interposed between the N-well serving as a drain region and the P-well. This increases the resistive component occurring during operation of the transistor, causing an increase in on-resistance. To address this, in this conventional structure, if the impurity concentration in the N-type epitaxial layer is increased in order to reduce the resistive component of the N-type epitaxial layer, breakdown voltage in the junction between the P-well layer and the N-type epitaxial layer will decrease. In this case, a decrease in static breakdown voltage is likely to occur in the curvature portion of the PN junction, because the electric field tends to particularly concentrate in that curvature portion.

In view of the above respects, it is an object of the present disclosure to provide a semiconductor device in which increased static breakdown voltage and decreased on-resistance are both achieved, and a method for fabricating the same.

In order to achieve the object, a first semiconductor device according to the present disclosure includes: a semiconductor substrate of a first conductivity type; a first drain offset region of a second conductivity type formed in the semiconductor substrate; a second drain offset region of the second conductivity type formed on the first drain offset region in the semiconductor substrate; a third drain offset region of the second conductivity type formed on the second drain offset region in the semiconductor substrate; a body region of the first conductivity type formed partly in the second drain offset region and partly in the third drain offset region; a gate electrode formed over part of the body region and part of the third drain offset region with a gate insulating film interposed therebetween; a source region of the second conductivity type formed in a surface portion of the body region, the surface portion being located laterally outwardly of and beneath the gate electrode; and a drain region of the second conductivity type, having a higher impurity concentration than the third drain offset region, formed in a surface portion of the third drain offset region at a distance from the gate insulating film, the surface portion being located on an opposite side of the gate electrode from the source region. An impurity concentration in the second drain offset region is lower than impurity concentrations in the first and third drain offset regions; and a curvature portion and bottom of the body region are both located in the second drain offset region.

In the first semiconductor device according to the present disclosure, the curvature portion of the body region is located in the second drain offset region in the middle part of the substrate, and the second drain offset region has a lower impurity concentration than the underling first and overlying third drain offset regions. This reduces the strength of the electric field in the curvature portion of the body region, that is, in the curvature portion of the PN junction between the second drain offset region and the body region, thereby enabling static breakdown voltage to increase.

Furthermore, in the first semiconductor device according to the present disclosure, a reduction in on-resistance is achievable by increasing the impurity concentration in the third drain offset region located in the upper part of the substrate. Even when the impurity concentration is increased in the third drain offset region in the upper part of the substrate, the increased impurity concentration does not cause a decrease in static breakdown voltage, because the third drain offset region is located away from the curvature portion of the PN junction between the second drain offset region and the body region.

Also, in the first semiconductor device according to the present disclosure, the impurity concentration in the first drain offset region located in the lower part of the substrate is not reduced. This makes it possible to suppress operation of a parasitic transistor formed by the semiconductor substrate of the first conductivity type, the first and second drain offset regions of the second conductivity type, and the body region of the first conductivity type, thereby avoiding deterioration of the semiconductor device.

Accordingly, the first semiconductor device according to the present disclosure achieves both increased static breakdown voltage and lowered on-resistance.

A first method for fabricating a semiconductor device according to the present disclosure includes the steps of: (a) forming, in a semiconductor substrate of a first conductivity type, a first drain offset region of a second conductivity type, a second drain offset region of the second conductivity type, and a third drain offset region of the second conductivity type in that order in a bottom-up manner; (b) forming a gate electrode over part of the third drain offset region with a gate insulating film interposed therebetween; (c) forming a body region of the first conductivity type in an area located partly in the second drain offset region and partly in the third drain offset region and located laterally outwardly of and beneath a side of the gate electrode, so that the body region is partially overlapped by the gate electrode; and (d) forming a source region of the second conductivity type in a surface portion of the body region, the surface portion being located laterally outwardly of and beneath the gate electrode, and forming a drain region of the second conductivity type having a higher impurity concentration than the third drain offset region, in a surface portion of the third drain offset region at a distance from the gate insulating film, the surface portion being located on an opposite side of the gate electrode from the source region. An impurity concentration in the second drain offset region is lower than impurity concentrations in the first and third drain offset regions; and a curvature portion and bottom of the body region are both located in the second drain offset region.

According to the first semiconductor device fabrication method according to the present disclosure, the curvature portion of the body region of the first conductivity type formed in the step (c) is located in the second drain offset region of the second conductivity type formed in the step (a). Also, the second drain offset region has a lower impurity concentration than the first and third drain offset regions of the second conductivity type formed in the step (a). This reduces the strength of the electric field in the curvature portion of the body region, that is, in the curvature portion of the PN junction between the second drain offset region and the body region, thereby enabling static breakdown voltage to increase.

Moreover, according to the first semiconductor device fabrication method according to the present disclosure, a reduction in on-resistance is achievable by increasing the impurity concentration in the third drain offset region formed in the step (a). Even when the impurity concentration is increased in the third drain offset region located in the upper part of the substrate, the increased impurity concentration does not cause a decrease in static breakdown voltage, because the third drain offset region is located away from the curvature portion of the PN junction between the second drain offset region and the body region.

Hence, according to the first semiconductor device fabrication method according to the present disclosure, increased static breakdown voltage and lowered on-resistance are both achievable.

A second semiconductor device according to the present disclosure includes: a semiconductor substrate of a first conductivity type; a first drain offset region of a second conductivity type formed in the semiconductor substrate; a body region of the first conductivity type formed in the first drain offset region; a gate electrode formed over part of the body region and part of the first drain offset region with a gate insulating film interposed therebetween; a source region of the second conductivity type formed in a surface portion of the body region, the surface portion being located laterally outwardly of and beneath the gate electrode; and a drain region of the second conductivity type, having a higher impurity concentration than the first drain offset region, formed in a surface portion of the first drain offset region at a distance from the gate insulating film, the surface portion being located on an opposite side of the gate electrode from the source region. A second drain offset region having a lower impurity concentration than the first drain offset region is formed by counter doping in an area of the first drain offset region in which a curvature portion and bottom of the body region are located.

In the second semiconductor device according to the present disclosure, the curvature portion of the body region is located in the second drain offset region located in the middle part of the substrate, and the second drain offset region has a lower impurity concentration than the overlying and underling first drain offset region. This reduces the strength of the electric field in the curvature portion of the body region, that is, in the curvature portion of the PN junction between the second drain offset region and the body region, thereby enabling static breakdown voltage to increase.

Furthermore, in the second semiconductor device according to the present disclosure, a reduction in on-resistance is achievable by increasing the impurity concentration in the part of the first drain offset region located in the upper part of the substrate. Even when the impurity concentration is increased in the part of the first drain offset region located in the upper part of the substrate, the increased impurity concentration does not cause a decrease in static breakdown voltage, because the part of the first drain offset region in the upper part of the substrate is located away from the curvature portion of the PN junction between the second drain offset region and the body region.

Also, in the second semiconductor device according to the present disclosure, the impurity concentration in the part of the first drain offset region located in the lower part of the substrate is not reduced. This makes it possible to suppress operation of a parasitic transistor formed by the semiconductor substrate of the first conductivity type, the first and second drain offset regions of the second conductivity type, and the body region of the first conductivity type, thereby avoiding deterioration of the semiconductor device.

Accordingly, the second semiconductor device according to the present disclosure achieves both increased static breakdown voltage and lowered on-resistance.

A second method for fabricating a semiconductor device according to the present disclosure includes the steps of: (a) forming, in a semiconductor substrate of a first conductivity type, a first drain offset region of a second conductivity type; (b) forming a gate electrode over part of the first drain offset region with a gate insulating film interposed therebetween; (c) forming a body region of the first conductivity type in an area of the first drain offset region so that the body region is partially overlapped by the gate electrode, the area being located laterally outwardly of and beneath a side of the gate electrode; (d) forming a source region of the second conductivity type in a surface portion of the body region, the surface portion being located laterally outwardly of and beneath the gate electrode, and forming a drain region of the second conductivity type having a higher impurity concentration than the first drain offset region, in a surface portion of the first drain offset region at a distance from the gate insulating film, the surface portion being located on an opposite side of the gate electrode from the source region; and (e) forming, by counter doping, a second drain offset region having a lower impurity concentration than the first drain offset region, in an area of the first drain offset region in which a curvature portion and bottom of the body region are located, after the step (c) is performed.

According to the second semiconductor device fabrication method according to the present disclosure, the curvature portion of the body region of the first conductivity type formed in the step (c) is located in the second drain offset region of the second conductivity type formed in the step (e). Also, the second drain offset region has a lower impurity concentration than the first drain offset region of the second conductivity type formed in the step (a). This reduces the strength of the electric field in the curvature portion of the body region, that is, in the curvature portion of the PN junction between the second drain offset region and the body region, thereby enabling static breakdown voltage to increase.

Moreover, according to the second semiconductor device fabrication method according to the present disclosure, a reduction in on-resistance is achievable by increasing the impurity concentration in the first drain offset region (the upper part of the substrate) formed in the step (a). Even when the impurity concentration is increased in the part of the first drain offset region located in the upper part of the substrate, the increased impurity concentration does not cause a decrease in static breakdown voltage, because the part of the first drain offset region in the upper part of the substrate is located away from the curvature portion of the PN junction between the second drain offset region and the body region.

Hence, according to the second semiconductor device fabrication method according to the present disclosure, increased static breakdown voltage and lowered on-resistance are both achievable.

As described above, according to the present disclosure, the impurity concentration can be reduced in the drain offset region in the middle part of the substrate where the curvature portion of the body region is located, thereby achieving high static breakdown voltage, while at the same time, the impurity concentration can be increased in the drain offset region in the upper part of the substrate, thereby achieving lowered on-resistance.

Accordingly, the present disclosure, which relates to semiconductor devices and their methods of fabrication, provides both increased breakdown voltage and lowered on-resistance, and is thus very useful.

DETAILED DESCRIPTION

First Embodiment

A semiconductor device and its method of fabrication according to a first embodiment of the present disclosure will be described by providing an N-type high voltage MOS transistor by way of example with reference to the accompanying drawings.

Figure 1A:
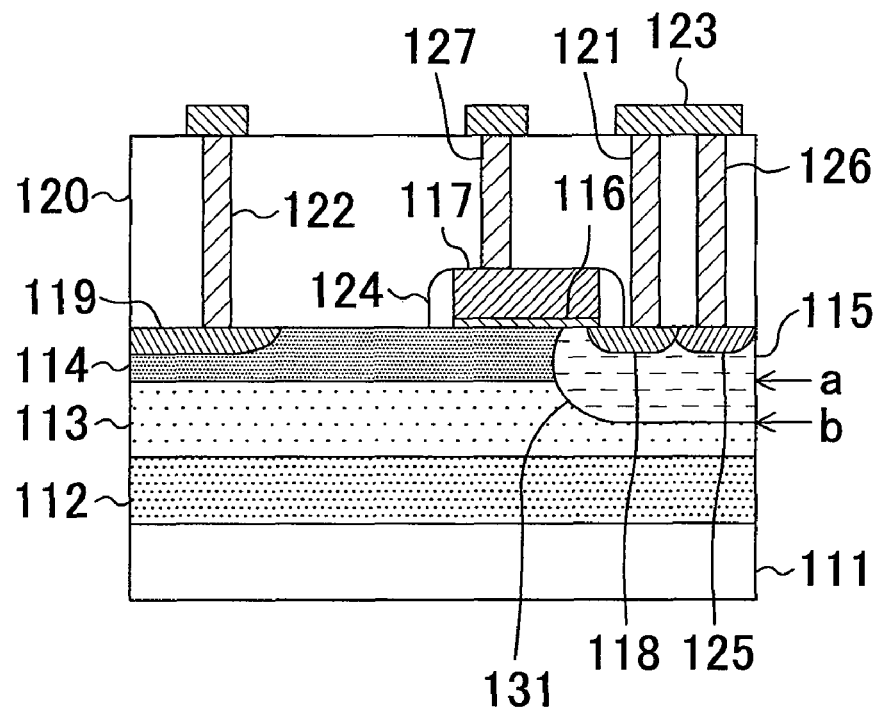
FIG. 1A is a cross-sectional view illustrating the structure of a semiconductor device according to a first embodiment of the present disclosure.

FIG. 1A is a cross-sectional view illustrating the structure of a semiconductor device according to the first embodiment.

As shown in FIG. 1A, a first $N^-$-type drain offset region 112, a second $N^-$-type drain offset region 113, a third $N^-$-type drain offset region 114 are formed in that order in a bottom up manner in a P-type semiconductor substrate 111. A $P^-$-type body region 115 is formed partly in the second drain offset region 113 and partly in the third drain offset region 114. A gate electrode 117 is formed over part of the body region 115 and part of the third drain offset region 114 with a gate insulating film 116 interposed therebetween. An insulating sidewall spacer 124 is formed on the sides of the gate electrode 117. An N+-type source region 118 is formed in a surface portion of the body region 115 that is located laterally outwardly of and beneath the gate electrode 117. An N+-type drain region 119, which has a higher impurity concentration than the third drain offset region 114, is formed at a distance from the gate electrode 117 in a surface portion of the third drain offset region 114 located on the other side of the gate electrode 117 from the source region 118. A P+-type body contact region 125, which has a higher impurity concentration than the body region 115, is formed in a surface portion of the body region 115 located on the other side of the source region 118 from the gate electrode 117.

Also, as shown in FIG. 1A, an interlayer dielectric film 120 is formed on the semiconductor substrate 111 as well as over the gate electrode 117, and contact plugs 121, 122, 126, and 127 are formed through the interlayer dielectric film 120. The contact plugs 121, 122, 126, and 127 are respectively coupled to the source region 118, the drain region 119, the body contact region 125, and the gate electrode 117. On the interlayer dielectric film 120, extraction electrodes 123 are formed, which are coupled to the respective contact plugs 121, 122, 126, and 127.

A first aspect of the first embodiment of the present disclosure is that the second drain offset region 113 has a lower impurity concentration than the first and third drain offset regions 112 and 114.

A second aspect of this embodiment is that the curvature portion (the curved portion connecting the side and bottom of the body region 115, represented by the reference numeral 131 in the figure) and bottom of the body region 115 are both located in the second drain offset region 113.

Figure 2A:
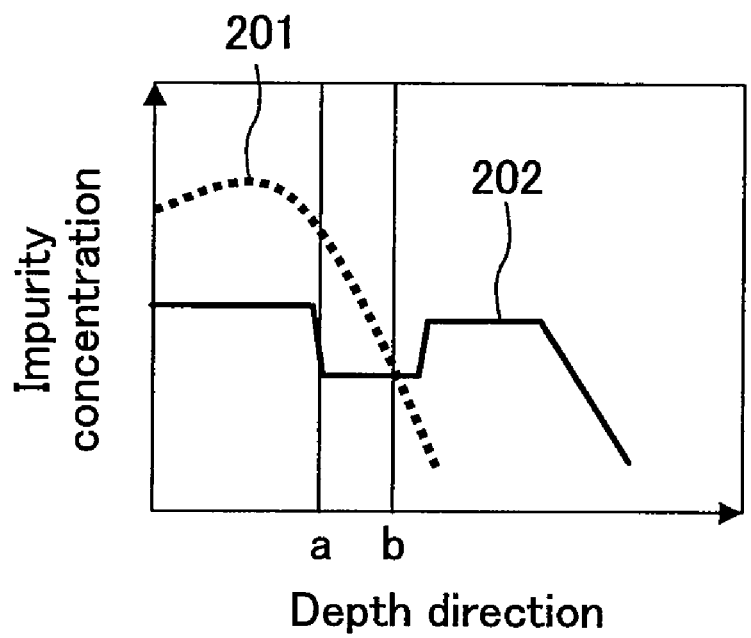
FIG. 2A shows an impurity concentration profile in the semiconductor device of the first embodiment of the present disclosure.

FIG. 2A shows a concentration profile 201 in the P−-type body region 115 and a concentration profile 202 in the first to third N−-type drain offset regions 112 to 114 in the semiconductor device of this embodiment shown in FIG. 1A. In FIGS. 1A and 2A, "a-b" indicates the area in the depth direction where the curvature portion 131 of the body region 115 (i.e., the curvature portion of the PN junction between the body region 115 and the second drain offset region 113) is located.

Figure 1B:
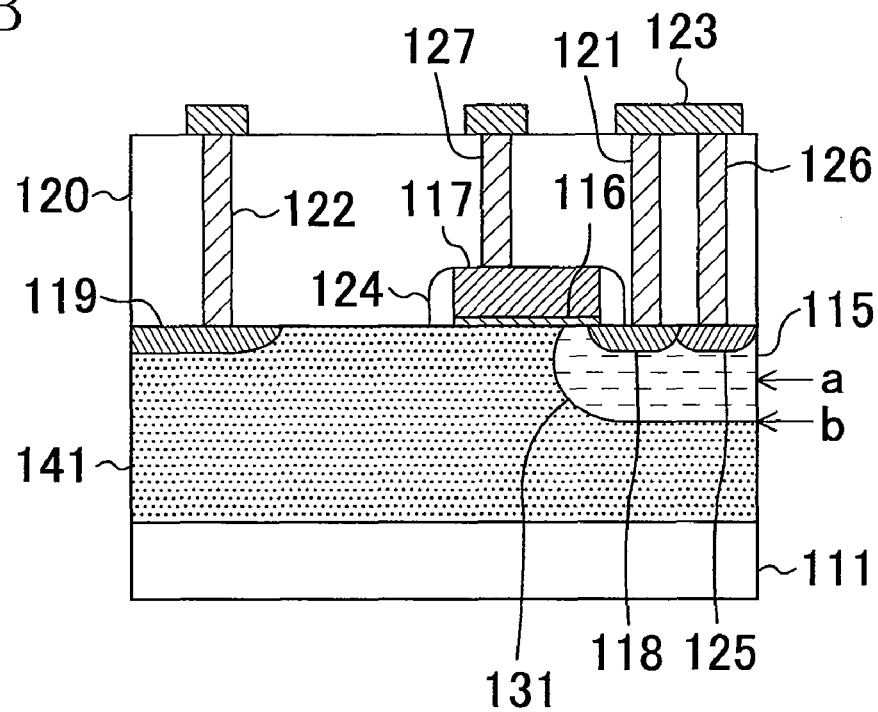
FIG. 1B is a cross-sectional view illustrating the structure of a semiconductor device according to a comparative example.

FIG. 1B is a cross-sectional view illustrating the structure of a semiconductor device according to a comparative example. In FIG. 1B, the same members as those of the semiconductor device of this embodiment shown in FIG. 1A are identified by the same reference numerals, and the description already presented will not be provided in order to avoid duplication. As shown in FIG. 1B, in the semiconductor device according to the comparative example, a single N−-type drain offset region 141 is formed in place of the first to third N−-type drain offset regions 112 to 114 of the semiconductor device of this embodiment shown in FIG. 1A.

Figure 2B:
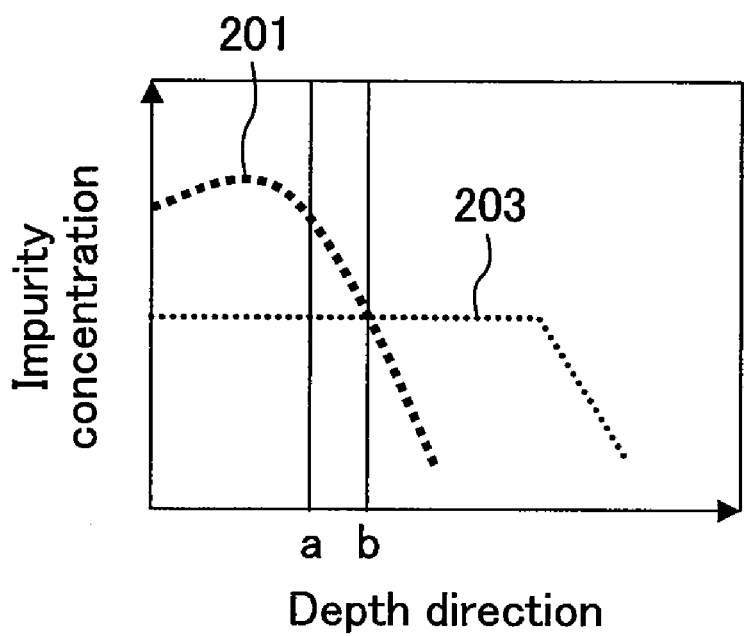
FIG. 2B shows an impurity concentration profile in the semiconductor device of the comparative example.

FIG. 2B shows a concentration profile 201 in a P−-type body region 115 and a concentration profile 203 in the N−-type drain offset region 141 in the semiconductor device of the comparative example shown in FIG. 1B. As shown in FIG. 2B, the impurity concentration in the drain offset region 141 is constant in the area where the body region 115 is formed.

Figure 3A:
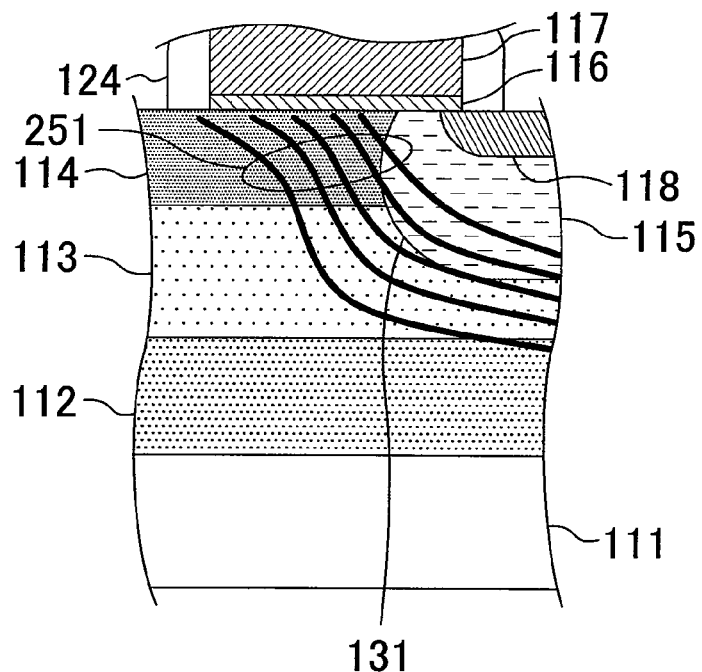
FIG. 3A shows a potential distribution in the semiconductor device of the first embodiment of the present disclosure.

FIG. 3A shows the distribution of an electric field in and around the curvature portion 131 of the body region 115 in the semiconductor device of this embodiment shown in FIG. 1A. In the semiconductor device of this embodiment, the curvature portion 131 of the body region 115 is located in the second drain offset region 113 having a relatively low impurity concentration. This permits expansion of the spacing (the spacing between equipotential lines) in a potential distribution 251 in the vicinity of the curvature portion 131 where the electric field is most likely to concentrate, as shown in FIG. 3A. Thus, the strength of the electric field is reduced in the curvature portion 131 of the body region 115, that is, in the curvature portion 131 of the PN junction between the second drain offset region 113 and the body region 115, thereby enabling static breakdown voltage to increase.

Figure 3B:
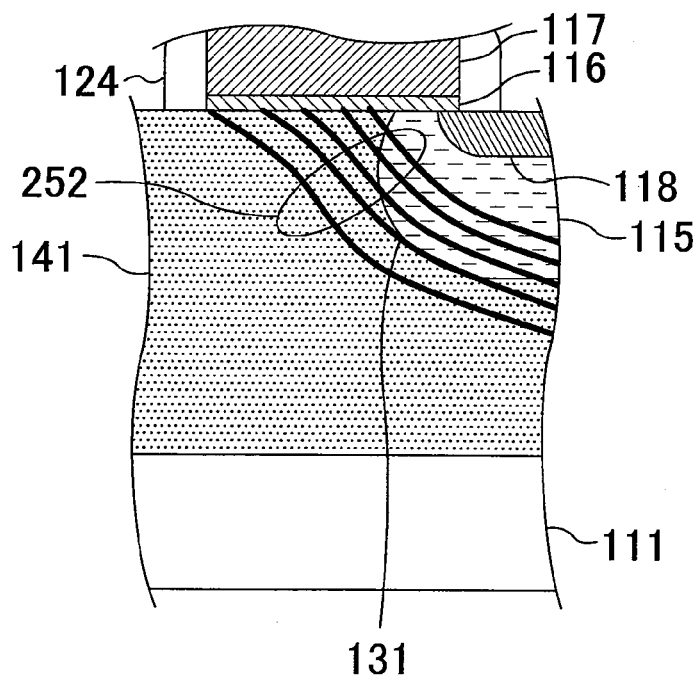
FIG. 3B shows a potential distribution in the semiconductor device of the comparative example.

FIG. 3B shows the distribution of an electric field in and around the curvature portion of the body region 115 in the semiconductor device of the comparative example shown in FIG. 1B. As shown in FIG. 3B, in the semiconductor device of the comparative example, the curvature portion of the body region 115 is located in the drain offset region 141 having a constant impurity concentration. Hence, the spacing (the spacing between equipotential lines) in a potential distribution 252 near the curvature portion is not expanded, and therefore, it is not possible to reduce the strength of the electric field in the curvature portion to increase static breakdown voltage.

In the semiconductor device according to this embodiment, while static breakdown voltage is increased as described above, the impurity concentration can be increased in the third drain offset region 114 located in the upper part of the substrate, thereby enabling on-resistance to be reduced. Even when the impurity concentration is increased in the third drain offset region 114 in the upper part of the substrate, the increased impurity concentration does not cause a decrease in static breakdown voltage, because the third drain offset region 114 is located away from the curvature portion 131 of the PN junction between the second drain offset region 113 and the body region 115.

Furthermore, in the semiconductor device of this embodiment, the impurity concentration in the first drain offset region 112 located in the lower part of the substrate is not reduced. This makes it possible to suppress operation of a parasitic transistor formed by the P-type semiconductor substrate 111, the first and second N−-type drain offset regions 112 and 113, and the P−-type body region 115, thereby avoiding deterioration of the semiconductor device.

In this way, the semiconductor device of this embodiment achieves high static breakdown voltage and low on-resistance.

Static breakdown voltage and on-resistance in the semiconductor device according to the first embodiment will be described more specifically. In the semiconductor device of this embodiment, the distance between the edge of the gate electrode 117 and the edge of the N+-type drain region 119 is 1.0 μm, for example. The impurity concentration in the P−-type body region 115 is about $5 \times 10^{17}$ ions/cm$^3$, for example. In the semiconductor device of the comparative example shown in FIG. 1B, the impurity concentration in the N−-type drain offset region 141, which is $5 \times 10^{16}$ ions/cm$^3$, for example, is uniformly low. In contrast, in the semiconductor device of the first embodiment, the impurity concentrations in the first to third N−-type drain offset regions 112, 113, and 114 are respectively $5 \times 10^{16}$ ions/cm$^3$, $1 \times 10^{16}$ ions/cm$^3$, and $6 \times 10^{16}$ ions/cm$^3$, for example. The impurity concentration in the second drain offset region 113, which is $1 \times 10^{16}$ ions/cm$^3$, is set lower than that in the first drain offset region 112, which is $5 \times 10^{16}$ ions/cm$^3$. On the other hand, the impurity concentration in the third drain offset region 114, which is $6 \times 10^{16}$ ions/cm$^3$, is set higher than that in the first drain offset region 112, which is $5 \times 10^{16}$ ions/cm$^3$. This prevents on-resistance from increasing.

Moreover, since the impurity concentration, i.e., $1 \times 10^{16}$ ions/cm$^3$, of the second drain offset region 113, where the curvature portion 131 of the body region 115 is located, is set lower than the impurity concentration, i.e., $5\times10^{16}$ ions/cm$^3$, of the first drain offset region 112, the potential distribution 251 in the vicinity of the curvature portion 131 is reduced. As a result, static breakdown voltage increases from 27V to 30V. The impurity concentration in the first drain offset region 112 is not reduced below $5\times10^{16}$ ions/cm$^3$. Therefore, it is possible to suppress operation of the parasitic transistor formed in the depth direction from the P$^-$-type body region 115.

As set forth above, in the semiconductor device of this embodiment, the impurity concentration in the second N$^-$-type drain offset region 113, where the curvature portion 131 of the body region 115 is located, is set lower than those in the underlying first and overlying third drain offset regions 112 and 114, thereby realizing a semiconductor device that inhibits on-resistance from increasing and that has high static breakdown voltage.

The following describes how to fabricate a semiconductor device according to the first embodiment with reference to FIGS. 4A to 4E. FIGS. 4A to 4E are cross-sectional views illustrating process steps of a method for fabricating a semiconductor device according to the first embodiment.

Figure 4A:
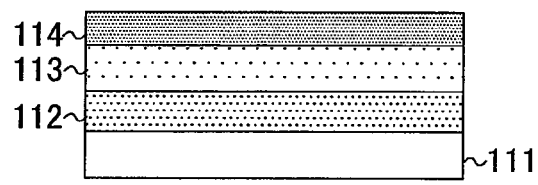
FIGS. 4A to 4E are cross-sectional views illustrating process steps of a method for fabricating a semiconductor device according to the first embodiment of the present disclosure.

First, as shown in FIG. 4A, an N-type dopant, e.g., phosphorus, is introduced into a P-type semiconductor substrate 111 using a known ion implantation technique. The P-type semiconductor substrate 111 is then subjected to a thermal diffusion process at 1000° C. for 60 minutes, for example, thereby forming a first N$^-$-type drain offset region 112 having an impurity concentration in the approximate range of $2\times10^{16}$ to $2\times10^{17}$ ions/cm$^3$ and having a depth of from about 1.0 μm to about 3.0 μm. Subsequently, similar process steps are performed to form a second N$^-$-type drain offset region 113 and a third N$^-$-type drain offset region 114. The second N$^-$-type drain offset region 113 has an impurity concentration in the approximate range of $2\times10^{15}$ to $1\times10^{16}$ ions/cm$^3$ and has a depth of from about 0.3 μm to about 1.5 μm. The third N$^-$-type drain offset region 114 has an impurity concentration in the approximate range of $2\times10^{16}$ to $2\times10^{17}$ ions/cm$^3$ and has a depth of from about 0.1 μm to about 0.5 μm.

Figure 4B:
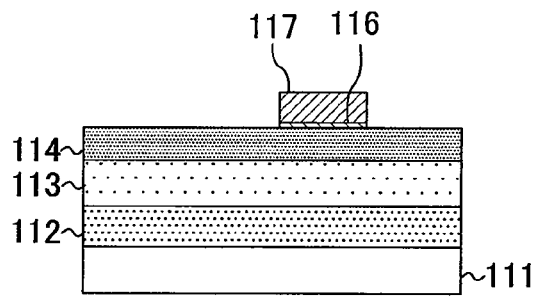

Then, as shown in FIG. 4B, a gate insulating film 116, made of silicon dioxide and having a thickness of from 5 to 100 nm, for example, is formed on the third drain offset region 114 using a known thermal oxidation technique. Next, a gate electrode formation film (not shown) made of a conductive film is deposited over the entire surface of the semiconductor substrate 111 by a CVD process, for example. Thereafter, a photoresist is formed on the gate electrode formation film. With the photoresist used as a mask, the gate electrode formation film is then patterned, thereby forming a gate electrode 117 having a thickness of from 0.2 to 1.0 μm, for example, on the gate insulating film 116. The gate electrode 117 may be formed, e.g., of polysilicon, a polycide layer made of WSi or the like, or a silicide layer made of a compound of metal and silicon, such as TiSi or CoSi.

Figure 4C:
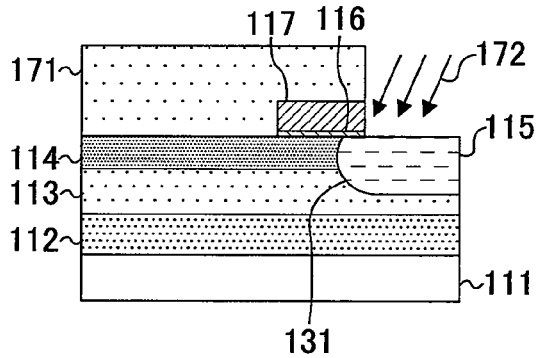

Next, as shown in FIG. 4C, a P-type dopant 172, e.g., boron, is introduced into the semiconductor substrate 111 by ion implantation using, as a mask, a photoresist 171 having an opening exposing a body region formation area of the semiconductor substrate 111, thereby forming a P$^-$-type body region 115 having an impurity concentration in the approximate range of $1\times10^{17}$ to $1\times10^{18}$ ions/cm$^3$. In this process step, the body region 115 is formed so that its curvature portion (denoted by the reference numeral 131 in the figure) and bottom are located in the second drain offset region 113.

Figure 4D:
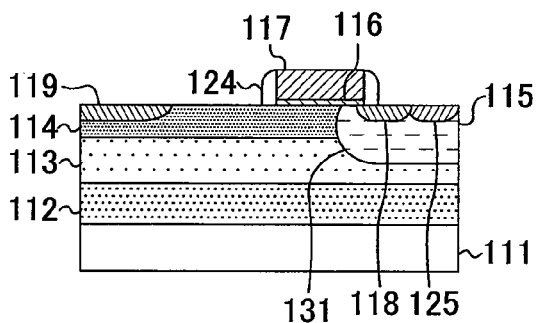

As shown in FIG. 4D, an insulating sidewall spacer 124 is subsequently formed on the sides of the gate electrode 117. Thereafter, as in typical MOS transistor fabrication methods, ions of an N-type dopant are implanted, thereby forming an N$^+$-type source region 118 and an N$^+$-type drain region 119. The N$^+$-type source region 118 is formed in a surface portion of the body region 115 that is located laterally outwardly of and beneath the gate electrode 117. The N$^+$-type drain region 119, having a higher impurity concentration than the third drain offset region 114, is formed at a distance from the gate insulating film 116 in a surface portion of the third drain offset region 114 located on the other side of the gate electrode 117 from the source region 118. Also, ions of a P-type dopant are implanted to form a P$^+$-type body contact region 125, having a higher impurity concentration than the body region 115, in a surface portion of the body region 115 located on the other side of the source region 118 from the gate electrode 117.

Figure 4E:
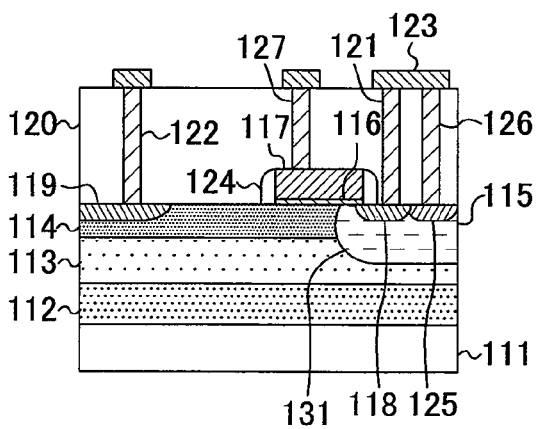

Next, as shown in FIG. 4E, an interlayer dielectric film 120 is formed on the semiconductor substrate 111 as well as over the gate electrode 117 by performing a predetermined process step. Contact plugs 121, 122, 126, and 127 are then formed through the interlayer dielectric film 120. The contact plugs 121, 122, 126, and 127 are respectively coupled to the source region 118, the drain region 119, the body contact region 125, and the gate electrode 117. Then, extraction electrodes 123, which are coupled to the respective contact plugs 121, 122, 126, and 127, are formed on the interlayer dielectric film 120. According to the above-described method, the semiconductor device of this embodiment can be fabricated.

In accordance with the semiconductor device fabrication method of this embodiment, the curvature portion 131 of the P$^-$-type body region 115 formed in the process step shown in FIG. 4C is located in the second N$^-$-type drain offset region 113 formed in the process step shown in FIG. 4A. Also, the second drain offset region 113 has a lower impurity concentration than the first and third N$^-$-type drain offset regions 112 and 114 formed in the process step of FIG. 4A. This allows the spacing (the spacing between equipotential lines) in the potential distribution 251 in the vicinity of the curvature portion 131 to be expanded as shown in FIG. 3A, thereby reducing the strength of the electric field in the curvature portion 131 and increasing static breakdown voltage.

Furthermore, according to the semiconductor device fabrication method of this embodiment, in the process step shown in FIG. 4A, the third N$^-$-type drain offset region 114 is formed so as to have a relatively high impurity concentration, thereby achieving a reduction in on-resistance.

Accordingly, the semiconductor device fabrication method of this embodiment enables the fabrication of a semiconductor device that inhibits on-resistance from increasing and that has sufficiently high static breakdown voltage.

It should be noted that although an N-type high voltage MOS transistor has been described by way of example in this embodiment, the present disclosure, when applied to a high voltage MOS transistor of the opposite type, i.e., a P-type high voltage MOS transistor, also produces similar effects.

Second Embodiment

A semiconductor device and its method of fabrication according to a second embodiment of the present disclosure will be described below with reference to the accompanying drawings. The semiconductor device of this embodiment differs from that of the first embodiment only in some of its components, and thus, the same components are identified by the same reference numerals and described briefly.

Figure 5:
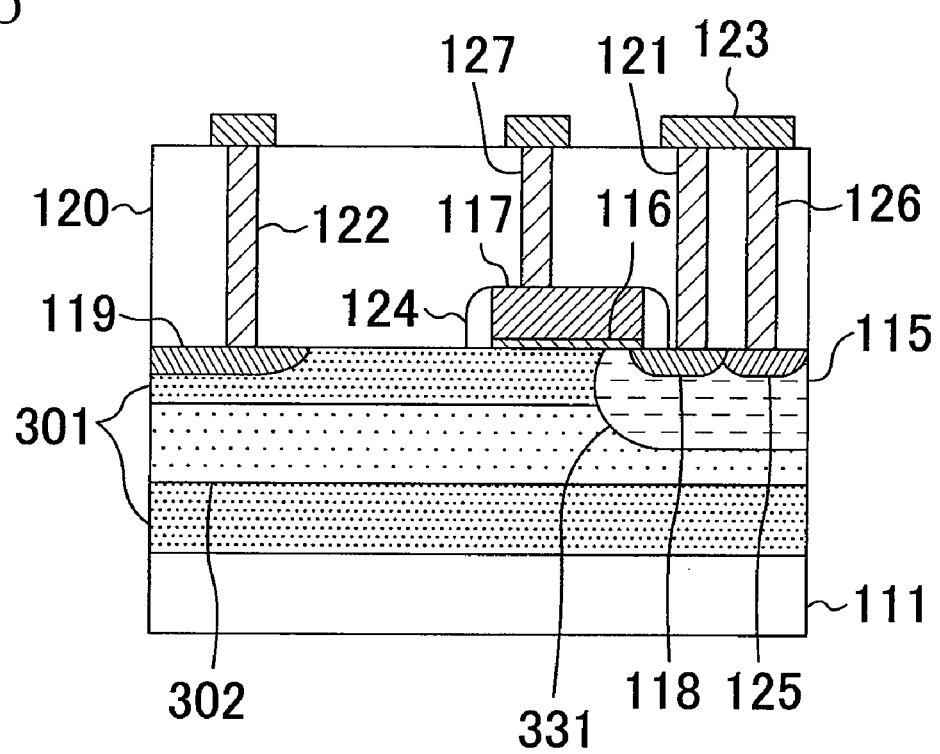
FIG. 5 is a cross-sectional view illustrating the structure of a semiconductor device according to a second embodiment of the present disclosure.

FIG. 5 is a cross-sectional view illustrating the structure of the semiconductor device according to the second embodiment.

As shown in FIG. 5, a first N$^-$-type drain offset region 301 is formed in a P-type semiconductor substrate 111. A P$^-$-type body region 115 is formed in the first drain offset region 301. A gate electrode 117 is formed over part of the body region 115 and part of the first drain offset region 301 with a gate insulating film 116 interposed therebetween. An insulating sidewall spacer 124 is formed on the sides of the gate electrode 117. An N$^+$-type source region 118 is formed in a surface portion of the body region 115 that is located laterally outwardly of and beneath the gate electrode 117. An N$^+$-type drain region 119, which has a higher impurity concentration than the first drain offset region 301, is formed at a distance from the gate electrode 117 in a surface portion of the first drain offset region 301 located on the other side of the gate electrode 117 from the source region 118. A P$^+$-type body contact region 125, having a higher impurity concentration than the body region 115, is formed in a surface portion of the body region 115 located on the other side of the source region 118 from the gate electrode 117.

An aspect of this embodiment is that a second N$^-$-type drain offset region 302 having a lower impurity concentration than the first drain offset region 301 is formed by counter-doping (in which a P-type dopant is introduced at a low concentration to reduce the N-type impurity concentration) in a part of the first drain offset region 301 where the curvature portion (represented by the reference numeral 331 in the figure) and bottom of the body region 115 are located.

In the above-described semiconductor device of this embodiment, the curvature portion 331 of the body region 115 is located in the second drain offset region 302 in the middle part of the substrate, and the second drain offset region 302 has a lower impurity concentration than the overlying and underling first drain offset region 301. Hence, it is possible to reduce the strength of the electric field in the curvature portion 331 (that is, in the curvature portion of the PN junction between the second drain offset region 302 and the body region 115), thereby increasing static breakdown voltage.

Also, in the semiconductor device of this embodiment, while static breakdown voltage is increased as set forth above, the impurity concentration can be increased in the part of the first drain offset region 301 located in the upper part of the substrate, thereby enabling on-resistance to be lowered. Even when the impurity concentration in the part of the first drain offset region 301 located in the upper part of the substrate is increased, the increased impurity concentration does not cause a decrease in static breakdown voltage, because the part of the first drain offset region 301 in the upper part of the substrate is located away from the curvature portion 331.

Furthermore, in the semiconductor device of this embodiment, the impurity concentration in the part of the first drain offset region 301 located in the lower part of the substrate is not reduced. This makes it possible to suppress operation of a parasitic transistor formed by the P-type semiconductor substrate 111, the first and second N$^-$-type drain offset regions 301 and 302, and the P$^-$-type body region 115, thereby avoiding deterioration of the semiconductor device.

In this way, the semiconductor device of this embodiment achieves high static breakdown voltage and low on-resistance.

The following describes how to fabricate a semiconductor device according to the second embodiment with reference to FIGS. 6A to 6E. FIGS. 6A to 6E are cross-sectional views illustrating process steps of a method for fabricating a semiconductor device according to the second embodiment.

Figure 6A:
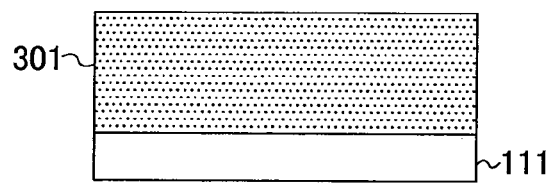
FIGS. 6A to 6E are cross-sectional views illustrating process steps of a method for fabricating a semiconductor device according to the second embodiment of the present disclosure.

First, as shown in FIG. 6A, an N-type dopant, e.g., phosphorus, is introduced into a P-type semiconductor substrate 111 using a known ion implantation technique. The P-type semiconductor substrate 111 is then subjected to a thermal diffusion process at 1000° C. for 60 minutes, for example, thereby forming a first N$^-$-type drain offset region 301 having an impurity concentration in the approximate range of $2\times10^{16}$ to $2\times10^{17}$ ions/cm$^3$ and having a depth of from about 0 μm to about 3 μm. In this process step, the first drain offset region 301 is formed so as to have a uniform impurity concentration distribution.

Figure 6B:
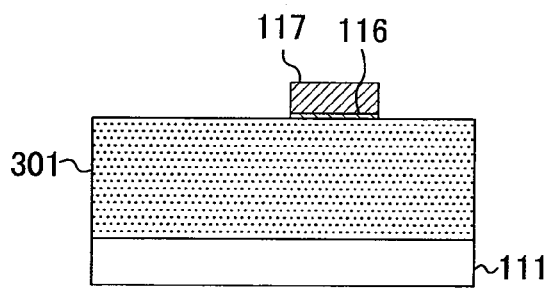

Then, as shown in FIG. 6B, a gate insulating film 116, made of silicon dioxide and having a thickness of from 5 to 100 nm, for example, is formed on the first drain offset region 301 using a known thermal oxidation technique. A gate electrode 117 is subsequently formed in the same manner as in the first embodiment.

Figure 6C:
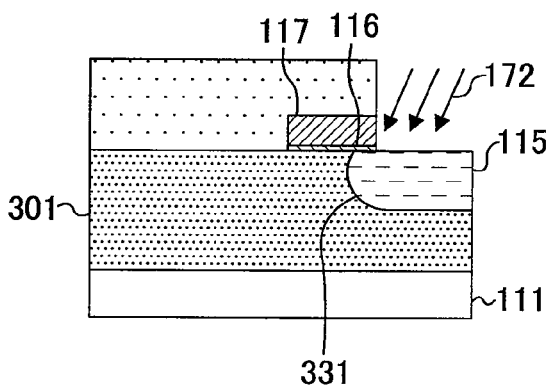

Next, as shown in FIG. 6C, a P-type dopant 172, e.g., boron, is introduced into the first drain offset region 301 by ion implantation using, as a mask, a photoresist 171 having an opening exposing a body region formation area of the semiconductor substrate 111, thereby forming a P$^-$-type body region 115 having an impurity concentration in the approximate range of $1\times10^{17}$ to $1\times10^{18}$ ions/cm$^3$.

Figure 6D:
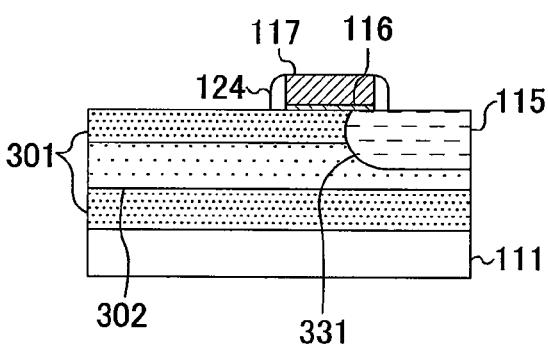

As shown in FIG. 6D, an insulating sidewall spacer 124 is then formed on the sides of the gate electrode 117. Thereafter, ions of a P-type dopant, e.g., boron, are implanted at a low dose into a part of the first drain offset region 301 where the curvature portion (denoted by the reference numeral 331 in the figure) and bottom of the body region 115 are located, thereby forming a second N$^-$-type drain offset region 302 having a lower impurity concentration than the first drain offset region 301; the impurity concentration in the second N$^-$-type drain offset region 302 is in the approximate range of $5\times10^{15}$ to $1\times10^{16}$ ions/cm$^3$, while the impurity concentration in the first drain offset region 301 is in the approximate range of $2\times10^{16}$ to $2\times10^{17}$ ions/cm$^3$.

Figure 6E:
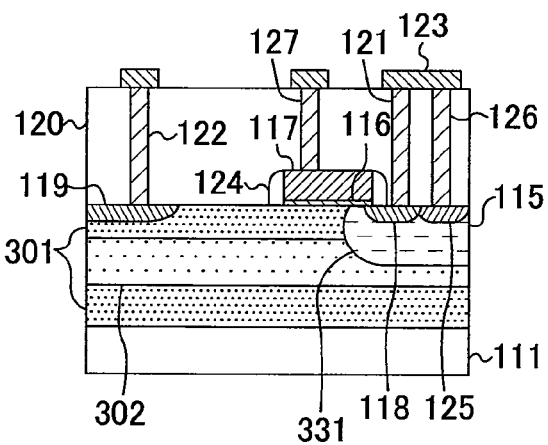
Figure 7:
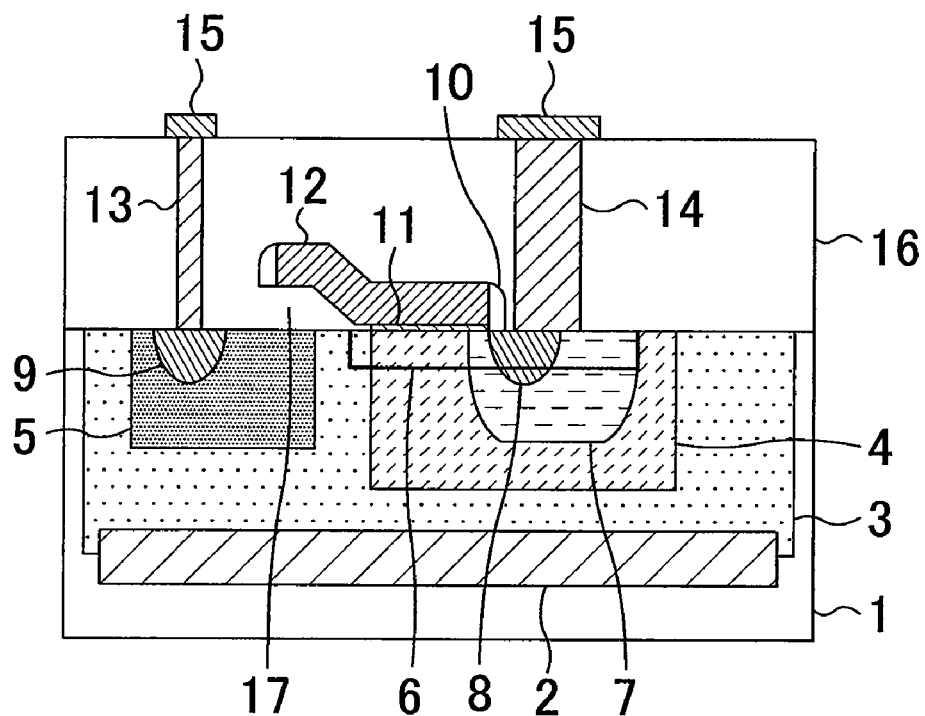
FIG. 7 is a cross-sectional view illustrating the structure of a conventional semiconductor device.

Then, as shown in FIG. 6E, an N$^+$-type source region 118, an N$^+$-type drain region 119, a P$^+$-type body contact region 125, an interlayer dielectric film 120, contact plugs 121, 122, 126, and 127, and extraction electrodes 123 are formed in the same manner as in the first embodiment. According to the above-described method, the semiconductor device of this embodiment can be fabricated.

In accordance with the semiconductor device fabrication method of this embodiment, the curvature portion 331 of the P$^-$-type body region 115 formed in the process step shown in FIG. 6C is located in the second N$^-$-type drain offset region 302 formed in the process step shown in FIG. 6D. Also, the second drain offset region 302 has a lower impurity concentration than the first N$^-$-type drain offset regions 301 formed in the process step shown in FIG. 6A. This reduces the strength of the electric field in the curvature portion 331, thereby increasing static breakdown voltage.

Furthermore, according to the semiconductor device fabrication method of this embodiment, in the process step shown in FIG. 6A, the first N$^-$-type drain offset region 301 is formed so that its upper part located in the upper part of the substrate has a relatively high impurity concentration, thereby achieving a reduction in on-resistance.

Accordingly, the semiconductor device fabrication method of this embodiment enables the fabrication of a semiconductor device that inhibits on-resistance from increasing and that has sufficiently high static breakdown voltage.

It should be noted that although an N-type high voltage MOS transistor has been described by way of example in this embodiment, the present disclosure, when applied to a high voltage MOS transistor of the opposite type, i.e., a P-type high voltage MOS transistor, also produces similar effects.

What is claimed is:

1. A semiconductor device, comprising:
   a semiconductor substrate of a first conductivity type;

a first drain offset region of a second conductivity type formed in the semiconductor substrate;

a second drain offset region of the second conductivity type formed on the first drain offset region in the semiconductor substrate;

a third drain offset region of the second conductivity type formed on the second drain offset region in the semiconductor substrate;

a body region of the first conductivity type formed partly in the second drain offset region and partly in the third drain offset region;

a gate electrode formed over part of the body region and part of the third drain offset region with a gate insulating film interposed therebetween;

a source region of the second conductivity type formed in a surface portion of the body region, the surface portion being located laterally outwardly of and beneath the gate electrode; and a drain region of the second conductivity type, having a higher impurity concentration than the third drain offset region, formed in a surface portion of the third drain offset region at a distance from the gate insulating film, the surface portion being located on an opposite side of the gate electrode from the source region, wherein an impurity concentration in the second drain offset region is lower than impurity concentrations in the first and third drain offset regions; and a curvature portion and bottom of the body region are both located in the second drain offset region.

2. A method for fabricating a semiconductor device, comprising the steps of:

(a) forming, in a semiconductor substrate of a first conductivity type, a first drain offset region of a second conductivity type, a second drain offset region of the second conductivity type, and a third drain offset region of the second conductivity type in that order in a bottom-up manner;

(b) forming a gate electrode over part of the third drain offset region with a gate insulating film interposed therebetween;

(c) forming a body region of the first conductivity type in an area located partly in the second drain offset region and partly in the third drain offset region and located laterally outwardly of and beneath a side of the gate electrode, so that the body region is partially overlapped by the gate electrode; and (d) forming a source region of the second conductivity type in a surface portion of the body region, the surface portion being located laterally outwardly of and beneath the gate electrode, and forming a drain region of the second conductivity type having a higher impurity concentration than the third drain offset region, in a surface portion of the third drain offset region at a distance from the gate insulating film, the surface portion being located on an opposite side of the gate electrode from the source region, wherein an impurity concentration in the second drain offset region is lower than impurity concentrations in the first and third drain offset regions; and a curvature portion and bottom of the body region are both located in the second drain offset region.

3. A semiconductor device, comprising:

a semiconductor substrate of a first conductivity type;

a first drain offset region of a second conductivity type formed in the semiconductor substrate;

a body region of the first conductivity type formed in the first drain offset region;

a gate electrode formed over part of the body region and part of the first drain offset region with a gate insulating film interposed therebetween;

a source region of the second conductivity type formed in a surface portion of the body region, the surface portion being located laterally outwardly of and beneath the gate electrode; and a drain region of the second conductivity type, having a higher impurity concentration than the first drain offset region, formed in a surface portion of the first drain offset region at a distance from the gate insulating film, the surface portion being located on an opposite side of the gate electrode from the source region, wherein a second drain offset region having a lower impurity concentration than the first drain offset region is formed by counter doping in an area of the first drain offset region in which a curvature portion and bottom of the body region are located.

4. A method for fabricating a semiconductor device, comprising the steps of:

(a) forming, in a semiconductor substrate of a first conductivity type, a first drain offset region of a second conductivity type;

(b) forming a gate electrode over part of the first drain offset region with a gate insulating film interposed therebetween;

(c) forming a body region of the first conductivity type in an area of the first drain offset region so that the body region is partially overlapped by the gate electrode, the area being located laterally outwardly of and beneath a side of the gate electrode;

(d) forming a source region of the second conductivity type in a surface portion of the body region, the surface portion being located laterally outwardly of and beneath the gate electrode, and forming a drain region of the second conductivity type having a higher impurity concentration than the first drain offset region, in a surface portion of the first drain offset region at a distance from the gate insulating film, the surface portion being located on an opposite side of the gate electrode from the source region; and (e) forming, by counter doping, a second drain offset region having a lower impurity concentration than the first drain offset region, in an area of the first drain offset region in which a curvature portion and bottom of the body region are located, after the step (c) is performed.

* * * * *